(12) United States Patent
Wang et al.

(10) Patent No.: US 6,727,184 B1
(45) Date of Patent: Apr. 27, 2004

(54) METHOD FOR COATING A THICK SPIN-ON-GLASS LAYER ON A SEMICONDUCTOR STRUCTURE

(75) Inventors: Wen-Yi Wang, Hsin-Chu (TW); Hsin-Chieh Huang, Hsin Chu Hsien (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/283,588

(22) Filed: Oct. 29, 2002

(51) Int. Cl.$^7$ .................. H01L 21/302; H01L 21/469
(52) U.S. Cl. .................. 438/712; 438/715; 438/723; 438/782
(58) Field of Search .................. 438/705, 694, 438/697, 725, 782, 760, 761, 593, 622, 623, 624, 626, 712, 715, 719, 723, 743, 691, 692, 693

(56) References Cited

U.S. PATENT DOCUMENTS

| | | | | |
|---|---|---|---|---|
| 5,312,512 A | * | 5/1994 | Allman et al. | 438/624 |
| 5,607,773 A | * | 3/1997 | Ahlburn et al. | 428/427 |
| 5,679,606 A | * | 10/1997 | Wang et al. | 438/763 |
| 5,888,905 A | * | 3/1999 | Taylor et al. | 438/705 |
| 5,893,750 A | * | 4/1999 | Hause | 438/633 |
| 6,008,116 A | * | 12/1999 | Tran | 438/623 |
| 6,010,963 A | * | 1/2000 | Allman et al. | 438/690 |
| 6,063,702 A | * | 5/2000 | Chung | 438/624 |
| 6,153,936 A | * | 11/2000 | Chao | 257/774 |
| 6,162,583 A | * | 12/2000 | Yang et al. | 430/313 |
| 6,197,660 B1 | * | 3/2001 | Jang et al. | 438/427 |
| 6,251,788 B1 | * | 6/2001 | Liou | 438/693 |
| 6,372,664 B1 | * | 4/2002 | Jang et al. | 438/778 |
| 6,448,150 B1 | * | 9/2002 | Tsai et al. | 438/427 |
| 6,472,750 B1 | * | 10/2002 | Sonego et al. | 257/758 |
| 6,573,147 B2 | * | 6/2003 | Moon et al. | 438/348 |
| 6,635,586 B2 | * | 10/2003 | Goo et al. | 438/782 |

* cited by examiner

Primary Examiner—Michael S. Lebentritt
(74) Attorney, Agent, or Firm—Tung & Associates

(57) ABSTRACT

A method for coating a thick spin-on-glass layer on a semiconductor structure without cracking problems and with improved planarization is disclosed. In the method, a pre-processed semiconductor structure that has a plurality of metal lines on top is first provided. After a first conformal layer of silicon oxide is deposited on top to insulate the metal lines, a first and a second layer of SOG are coated on top to a total thickness of at least 2500 Å. On top of the second SOG layers, is then deposited a second layer of silicon oxide by a plasma enhanced oxide deposition technique to a thickness of at least 1000 Å. A third and a fourth SOG layer are then coated on top of the stress buffer layer to a total thickness of at least 2500 Å.

20 Claims, 1 Drawing Sheet

METHOD FOR COATING A THICK SPIN-ON-GLASS LAYER ON A SEMICONDUCTOR STRUCTURE

FIELD OF THE INVENTION

The present invention generally relates to a method for coating a thick spin-on-glass (SOG) layer on a semiconductor structure and more particularly, relates to a method for coating a thick SOG layer on a semiconductor structure without cracking problems by adding a stress buffer layer of silicon oxide in-between two spin-on-glass layers on top of the semiconductor structure.

BACKGROUND OF THE INVENTION

Spin-on-glass (SOG) is frequently used for gap fill and planarization of inter-level dielectrics (ILD) in multi-level metalization structures. It is a desirable material for use in low-cost fabrication of IC circuits. Most commonly used SOG materials are of two basic types; an inorganic type of silicate based SOG and an organic type of siloxane based SOG. One of the commonly used organic type SOG materials is a silicon oxide based polysiloxane which is featured with radical groups replacing or attaching to oxygen atoms. Based on these two basic structures, the molecular weight, the viscosity and the desirable film properties of SOG can be modified and adjusted to suit the requirement of specific IC fabrication process.

SOG film is typically applied to a pre-deposited oxide surface as a liquid to fill gaps and steps on the substrate. Similar to the application method for photoresist films, a SOG material can be dispensed onto a wafer and spun with a rotational speed which determines the thickness of the SOG layer desired. After the film is evenly applied to the surface of the substrate, it is cured at a temperature of approximately 400° C. and then etched back to obtain a smooth surface in preparation for a capping oxide layer on which a second interlevel metal may be patterned. The purpose of the etch-back step is to leave SOG between metal lines but not on top of the metal, while the capping oxide layer is used to seal and protect SOG during further fabrication processes. The siloxane based SOG material is capable of filling 0.15 micron gaps and therefore it can be suitably used in 0.25 micron technology.

When fully cured, silicate SOG has similar properties like those of silicon dioxide. Silicate SOG does not absorb water in significant quantity and is thermally stable. However, one disadvantage of silicate SOG is the large volume shrinkage during curing. As a result, the silicate SOG retains high stress and cracks easily during curing and further handling. The cracking of the SOG layer can cause a serious contamination problem for the fabrication process. The problem can sometimes be avoided by the application of only a thin layer, i.e. 1000~2000 Å of the silicate SOG material.

In order to reach a final thickness of several thousand angstrom of the SOG layer, several thinner layers of the silicate SOG material must be deposited. However, it has been found that even by depositing multiple thinner layers of SOG, i.e. in as many as four separate deposition steps, the final SOG layer obtained may still have a cracking problem during curing or subsequent processing. The problem becomes even more severe when structures of high aspect ratio or poor topography are involved. The conventional multi-step deposition technique for depositing a thick SOG layer leads to either a cracking problem or poor planarization.

It is therefore an object of the present invention to provide a method for coating a thick spin-on-glass layer without the drawbacks or shortcomings of the conventional methods.

It is another object of the present invention to provide a method for coating a thick spin-on-glass layer on a semiconductor structure without cracking problems.

It is a further object of the present invention to provide a method for coating a thick spin-on-glass layer on a semiconductor structure that has improved planarity.

It is another further object of the present invention to provide a method for coating a thick spin-on-glass layer on a semiconductor structure without cracking problems by incorporating a center stress buffer layer in-between two SOG layers.

It is still another object of the present invention to provide a method for coating a thick spin-on-glass layer on a semiconductor structure without cracking problems by incorporating a PE oxide layer in-between two SOG layers.

SUMMARY OF THE INVENTION

In accordance with the present invention, a method for coating a thick spin-on-glass layer on a semiconductor structure without cracking problems is disclosed.

In a preferred embodiment, a method for coating a thick spin-on-glass layer on a semiconductor structure without cracking problems can be carried out by the operating steps of providing a pre-processed semiconductor structure that has a plurality of metal lines formed on top; depositing conformally a first layer of silicon oxide insulating the metal lines; coating a first layer of SOG on top of the first layer of silicon oxide to a thickness of at least 1000 Å; coating a second layer of SOG on top of the first SOG layer to a thickness of at least 1000 Å; annealing the semiconductor structure at a temperature of at least 300° C.; depositing a second layer of silicon oxide on top of the second SOG layer to a thickness of at least 1000 Å; coating a third layer of SOG on top of the second layer of silicon oxide to a thickness of at least 1000 Å; coating a fourth layer of SOG on top of the third SOG layer to a thickness of at least 1000 Å; and etching back the third and fourth layers of SOG to substantially planarize the semiconductor structure.

The method for coating a thick spin-on-glass layer on a semiconductor structure without cracking problems may further include the step of depositing a third layer of silicon oxide on top of the fourth layer of SOG to substantially planarize the semiconductor structure, or the step of depositing the first and second layers of silicon oxide by a plasma enhanced oxide deposition technique, or the step of coating the first and second layers of SOG to a total thickness of at least 3000 Å, or the step of coating the third and fourth layers of SOG to a total thickness of at least 3000 Å. The method may further include the step of conducting the annealing process at a first temperature and then at a second temperature that is higher than the first temperature, or the step of conducting the annealing process first at a temperature between about 300° C. and about 400° C. and then at a temperature between about 350° C. and about 450° C. The method may further include the step of depositing the second layer of silicon oxide to a thickness of at least 2000 Å, or the step of etching back the third and fourth layers of SOG by a reactive ion etching technique, or the step of depositing the second layer of silicon oxide as a stress buffer layer.

The present invention is further directed to a method for coating a spin-on-glass layer on a semiconductor structure without cracking problems which can be carried out by the steps of first providing a pre-processed semiconductor structure with a plurality of metal lines formed on top; depositing conformally a first layer of silicon oxide insulating the plurality of metal lines; coating a first layer of SOG on top of the first layer of silicon oxide to a thickness of at least 2500 Å; annealing the semiconductor structure at a temperature of at least 300° C.; depositing a stress buffer layer of an insulating material on top of the first SOG layer to a thickness of at least 1000 Å; coating a second layer of SOG on top of the stress buffer layer of insulating material to a thickness of at least 2500 Å; and etching back the second layer of SOG to substantially planarize the semiconductor structure.

The method for coating a thick spin-on-glass layer on a semiconductor structure without cracking problems may further include the step of depositing a third layer of silicon oxide on top of the second layer of SOG to substantially planarize the semiconductor structure. The method may further include the step of depositing the first and second layers of silicon oxide by a plasma enhanced oxide deposition technique. The method may further include the step of depositing the stress buffer layer of plasma enhanced oxide. The method may further include the step of conducting the annealing process at a first temperature between about 300° C. and about 400° C. and then at a second temperature between about 350° C. and about 450° C. The method may further include the step of depositing the stress buffer layer of insulating material to a thickness of at least 2000 Å, or the step of etching back the second layer of SOG by a reactive ion etching techique. The method may further include the step of depositing the stress buffer layer with silicon nitride or silicon oxynitride.

BRIEF DESCRIPTION OF THE DRAWINGS

These and other objects, features and advantages of the present invention will become apparent from the following detailed decription and the appended drawings in which.

DETAILED DESCRIPTION OF THE PREFERRED EMBODIMENT

The present invention discloses a method for coating a thick spin-on-glass layer on a semiconductor structure without cracking problems and with improved planarization is disclosed.

The method can be carried out by depositing two SOG layers with a stress buffer layer sandwiched therein between. For instance, the method can be carried out by first providing a semiconductor structure that has a plurality of metal lines formed on top and a conformal silicon oxide layer insulating the metal lines. A first and a second layer of SOG are then sequentially deposited on top of the structure to a total thickness of at least 2500 Å. After the structure is annealed at a temperature of at least 300° C., a stress buffer layer of silicon oxide is deposited on top of the second SOG layer to a thickness of at least 1000 Å. Subsequently, a third and a fourth layer of SOG are deposited on top of the stress buffer layer to a thickness of at least 2500 Å. The final structure is then etched back to substantially planarize the semiconductor structure.

The stress buffer layer may be suitably formed of a plasma enhanced oxide (PEOX) layer that is sandwiched between two SOG layers of substantial thickness, i.e. at least 2500 Å thick. The annealing process for the first two SOG layers prior to the deposition of the stress buffer layer can be carried out by a dual-step annealing. For instance, the annealing can be carried out at a first temperature between about 300° C. and about 400° C. for a time period between about 10 min. and about 60 min., and then at a second temperature between about 350° C. and about 450° C. for a time period between about 10 min. and about 60 min.

Figure 1A:
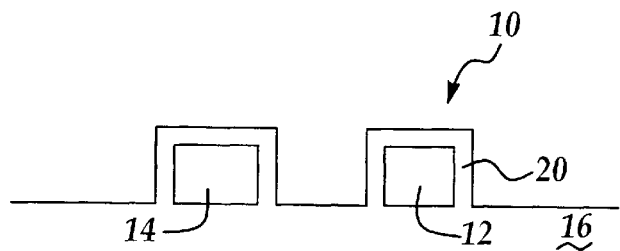
FIG. 1A is an enlarged, cross-sectional view of a present invention semiconductor structure with a plurality of metal lines formed on top covered by a silicon oxide insulating layer.
Figure 1B:
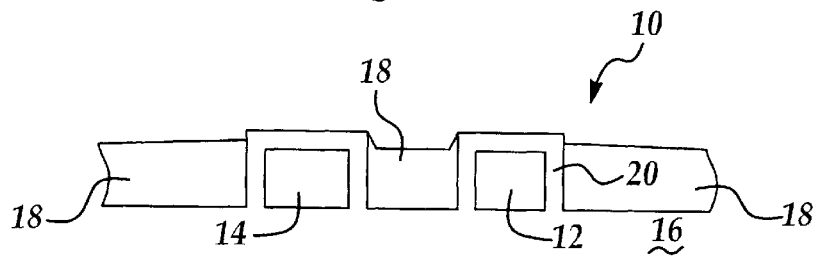
FIG. 1B is an enlarged, cross-sectional view of the semiconductor structure of FIG. 1A with a first and a second SOG layer deposited on the structure.

The present invention novel method for coating a thick spin-on-glass layer on a semiconductor structure without cracking problems and with improved planarization can be illustrated in FIG. 1A~1E. Referring initially to FIG. 1A, wherein a present invention semiconductor structure 10 is shown. The semiconductor structure 10 is a pre-processed substrate 16 with a plurality of metal lines 12, 14 formed on top. On top of the metal lines 12, 14 is deposited a conformal insulating layer 20 of a silicon oxide material. A suitable silicon oxide layer 20 can be formed by a plasma enhanced oxide technique into a PEOX layer.

The semiconductor structure 10 is then coated with a first SOG layer and a second SOG layer sequentially to form a SOG layer 18. The coating processes can be conducted sequentially with each of the first and the second layers coated to a thickness of at least 1000 Å, or to a total thickness of the two layers to at least 2500 Å. The coating process can be carried out in a conventional spin coating apparatus that will not be described in detail.

Figure 1C:
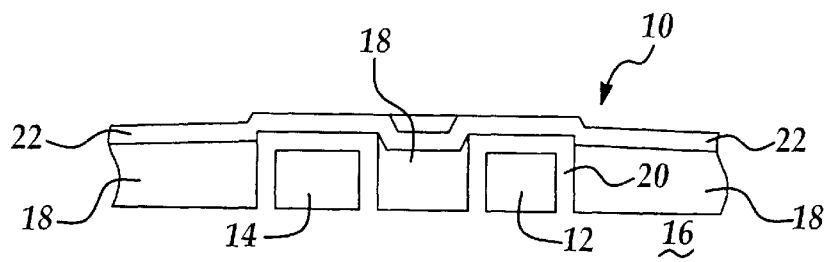
FIG. 1C is an enlarged, cross-sectional view of the present invention semiconductor structure of FIG. 1B with a stress buffer layer of silicon oxide deposited on top.

In the next step of the process, as shown in FIG. 1C, a second layer 22 of silicon oxide can be conformally deposited by a plasma enhanced oxide deposition technique. The second silicon oxide layer 22 is a stress buffer layer of the present invention novel method which should be deposited to a thickness of at least 1000 Å, preferably at least 2000 Å, and more preferably at least 2500 Å. Prior to the deposition of the second silicon oxide layer 22, the semiconductor structure 10 with the first and second layer of SOG deposited on top should be cured at a predetermined curing condition. For instance, a suitable curing or annealing condition for the semiconductor structure 10 with the SOG layer 18 on top is a dual-step annealing process in which a first annealing temperature followed by a second annealing temperature higher than the first temperature is carried out. A suitable first step annealing temperature may be between about 300° C. and about 400° C., and preferably between about 350° C. and about 380° C. for a time period between about 10 min. and about 60 min., and preferably between about 20 min. and about 40 min. The first low temperature annealing process is then followed by a second higher temperature annealing process which can be suitably conducted at a temperature range between about 350° C. and about 450° C., preferably between about 390° C. and about 440° C. for a time period between about 10 min. and about 60 min., and preferably between about 30 min. and about 50 min. The dual-step annealing process provides improved stress relieving mechanism for the SOG layers prior to the deposition of the stress buffing layer of the present invention on top. The word "about" used in this writing indicates a range of values that is ±10% of an average value given.

Figure 1D:
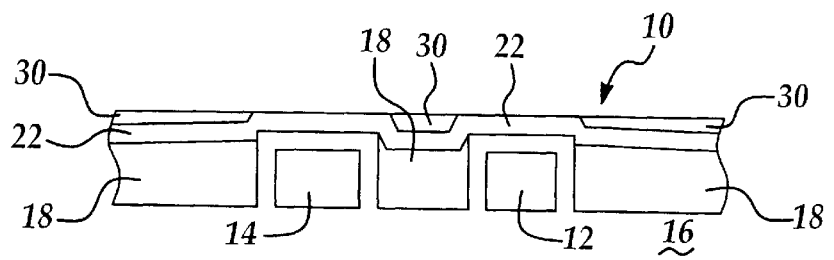
FIG. 1D is an enlarged, cross-sectional view of the present invention semiconductor structure of FIG. 1C with a third and a fourth SOG layer deposited on top and then planarized.
Figure 1E:
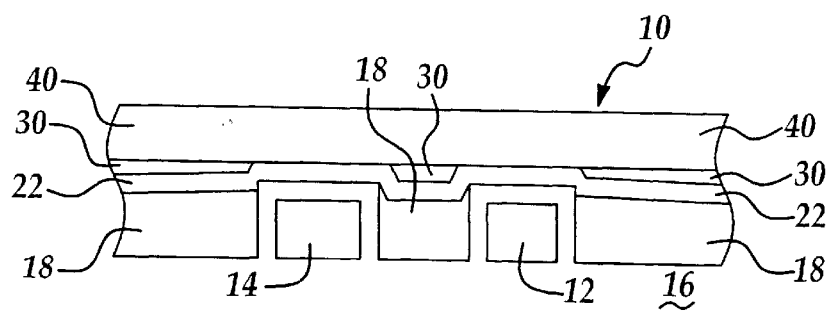
FIG. 1E is an enlarged, cross-sectional view of the present invention semiconductor structure of FIG. 1D with a third PE oxide layer deposited on top for planarization.

The final thickness of the SOG layer is then deposited as shown in FIG. 1D, in a third coating step followed by a fourth coating step of SOG. The combined thickness of the SOG layer is then etched back with leftover SOG layer 30 shown in FIG. 1D. The etch-back process can be carried out by a dry etching technique such as a reactive ion etching technique. In the etch-back process, approximately 4000 Å thickness of the third and fourth SOG coating is removed. The present invention novel method is therefore completed as shown in FIG. 1D. Optionally, a third PE oxide layer 40 can be deposited on top of the third/fourth SOG layer 30 and the stress buffer layer 22 to planarize the semiconductor structure 10. This is shown in FIG. 1E.

The present invention novel method for coating a thick spin-on-glass layer on a semiconductor structure without cracking problems and with improved planarization has therefore been amply described in the above description and in the appended drawings of FIG. 1A~1E.

While the present invention has been described in an illustrative manner, it should be understood that the terminology used is intended to be in a nature of words of description rather then of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for coating a thick spin-on-glass layer without cracking problems on a semiconductor structure comprising the steps of:
   providing a pre-processed semiconductor structure with a plurality of metal lines formed on top;
   depositing conformally a first layer of silicon oxide insulating said metal lines;
   coating a first layer of spin-on-glass (SOG) on top of said first layer of silicon oxide;
   coating a second layer of SOG on top of said first SOG layer;
   annealing said semiconductor structure;
   depositing a second layer of silicon oxide on top of said second SOG layer;
   coating a third layer of SOG on top of said second layer of silicon oxide;
   coating a fourth layer of SOG on top of said third SOG layer; and
   etching back said third and fourth layers of SOG to substantially planarize said semiconductor structure.

2. A method for coating a thick spin-on-glass layer without cracking problems on a semiconductor structure according to claim 1 further comprising the step of depositing said first, said second, said third and said fourth layer of SOG to a thickness of at least 1000 Å.

3. A method for coating a thick spin-on-glass layer without cracking problems on a semiconductor structure according to claim 1 further comprising the step of depositing said first and second layer of silicon oxide by a plasma enhanced oxide (PEOX) deposition technique.

4. A method for coating a thick spin-on-glass layer without cracking problems on a semiconductor structure according to claim 1 further comprising the step of coating said first and second layer of SOG to a total thickness of at least 3000 Å.

5. A method for coating a thick spin-on-glass layer without cracking problems on a semiconductor structure according to claim 1 further comprising the step of coating said third and fourth layer of SOG to a total thickness of at least 3000 Å.

6. A method for coating a thick spin-on-glass layer without cracking problems on a semiconductor structure according to claim 1 further comprising the step of conducting said annealing process at a first temperature and then at a second temperature higher than said first temperature.

7. A method for coating a thick spin-on-glass layer without cracking problems on a semiconductor structure according to claim 6 further comprising the step of conducting said annealing process first at a temperature between about 300° C. and about 400° C. and then at a temperature between about 350° C. and about 450° C.

8. A method for coating a thick spin-on-glass layer without cracking problems on a semiconductor structure according to claim 1 further comprising the step of annealing said semiconductor structure at a temperature of at least 300° C.

9. A method for coating a thick spin-on-glass layer without cracking problems on a semiconductor structure according to claim 1 further comprising the step of etching back said third and fourth layers of SOG by a reactive ion etching technique.

10. A method for coating a thick spin-on-glass layer without cracking problems on a semiconductor structure according to claim 1 further comprising the step of depositing said second layer of silicon oxide as a stress buffer layer.

11. A method for coating a spin-on-glass layer on a semiconductor structure without cracking problems comprising the steps of:
    providing a pre-processed semiconductor structure with a plurality of metal lines formed on top;
    depositing conformally a first layer of silicon oxide insulating said metal lines;
    coating a first layer of spin-on-glass (SOG) on top of said first layer of silicon oxide;
    annealing said semiconductor structure;
    depositing a stress buffer layer of an insulating material on top of said first SOG layer;
    coating a second layer of SOG on top of said stress buffer layer of insulating material; and
    etching back said second layer of SOG to substantially planarize said semiconductor structure.

12. A method for coating a thick spin-on-glass layer on a semiconductor structure without cracking problems according to claim 11 further comprising the step of depositing a third layer of silicon oxide on top of said second layer of SOG to substantially planarize said semiconductor structure.

13. A method for coating a thick spin-on-glass layer on a semiconductor structure without cracking problems according to claim 11 further comprising the step of depositing said first and second layer of silicon oxide to a thickness of at least 2500 Å.

14. A method for coating a thick spin-on-glass layer on a semiconductor structure without cracking problems according to claim 11 further comprising the step of depositing said stress buffer layer of plasma enhanced oxide.

15. A method for coating a thick spin-on-glass layer on a semiconductor structure without cracking problems according to claim 11 further comprising the step of conducting said annealing process at a first temperature and then at a second temperature higher than said first temperature.

16. A method for coating a thick spin-on-glass layer on a semiconductor structure without cracking problems according to claim 15 further comprising the step of conducting said annealing process first at a temperature between about 300° C. and about 400° C. and then at a temperature between about 350° C. and about 450° C.

17. A method for coating a thick spin-on-glass layer on a semiconductor structure according without cracking problems to claim 11 further comprising the step of depositing said stress buffer layer of insulating material to a thickness of at least 2000 Å.

18. A method for coating a thick spin-on-glass layer on a semiconductor structure without cracking problems according to claim 11 further comprising the step of etching back said second layer of SOG by a reactive ion etching technique.

19. A method for coating a thick spin-on-glass layer on a semiconductor structure without cracking problems according to claim 11 further comprising the step of depositing said stress buffer layer of silicon nitride.

20. A method for coating a thick spin-on-glass layer on a semiconductor structure without cracking problems according to claim 11 further comprising the step of depositing said stress buffer layer of silicon oxynitride.

* * * * *